(12) United States Patent
Acharya et al.

(10) Patent No.: US 6,819,624 B2
(45) Date of Patent: Nov. 16, 2004

(54) LATENCY TIME CIRCUIT FOR AN S-DRAM

(75) Inventors: Pramod Acharya, München (DE);
Stefan Dietrich, Türkenfeld (DE);
Sabine Kieser, Hausham (DE); Peter Schroegmeier, München (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/249,029

(22) Filed: Mar. 11, 2003

(65) Prior Publication Data

US 2003/0174550 A1 Sep. 18, 2003

(30) Foreign Application Priority Data

Mar. 12, 2002 (DE) .......................................... 102 10 726

(51) Int. Cl.[7] ................................................ G11C 8/00
(52) U.S. Cl. ................... 365/233; 365/194; 365/230.08
(58) Field of Search ............................. 365/233, 189.04, 365/189.05, 194, 230

(56) References Cited

U.S. PATENT DOCUMENTS 5,781,766 A    7/1998  Davis 6,317,381 B1      11/2001  Gans et al.
6,606,277 B2 *    8/2003   Takahashi .................... 365/233
2002/0003747 A1 * 1/2002   Yahata et al. ............... 365/233

FOREIGN PATENT DOCUMENTS

DE             19719996          1/1998

* cited by examiner

Primary Examiner—Richard Elms
Assistant Examiner—Toan Le
(74) Attorney, Agent, or Firm—Moore & Van Allen PLLC; Steven B. Phillips

(57) ABSTRACT

Latency time circuit for an S-DRAM, which is clocked by a high-frequency clock signal for producing a delayed data enable control signal for synchronous data transfer through a data path of the S-DRAM, having at least one controllable latency time generator for delaying a decoded data enable control signal with an adjustable latency time, characterized by at least one comparison circuit, which compares the cycle time of the high-frequency clock signal with a predetermined decoding time and by a signal delay circuit which can be switched on by means of the comparison circuit in order to delay the decoded data enable control signal with a predetermined delay time, in which the signal delay circuit is switched on by the comparison circuit when the cycle time of the clock signal is in a limit time region which is located about the predetermined decoding time.

37 Claims, 15 Drawing Sheets

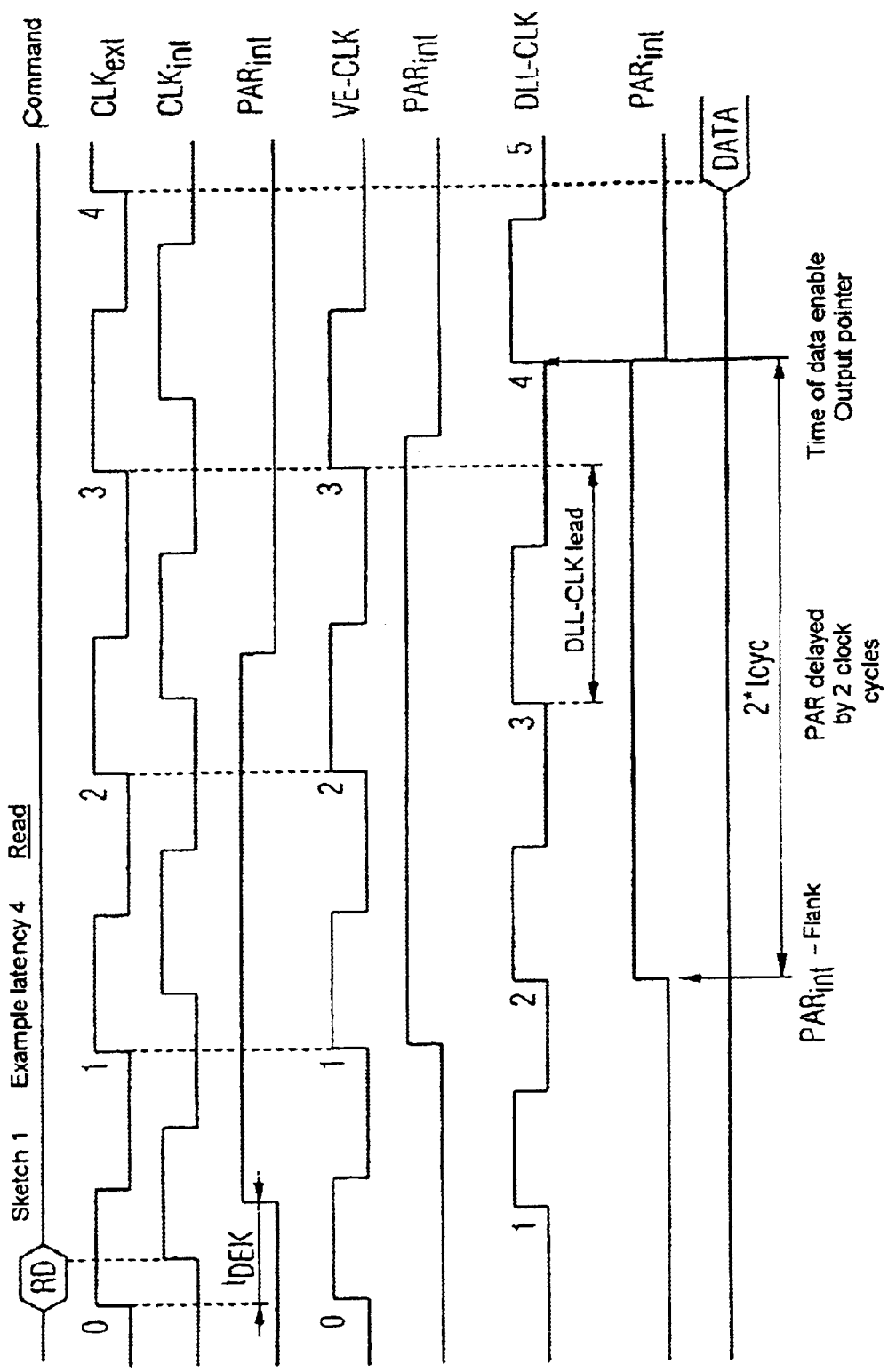

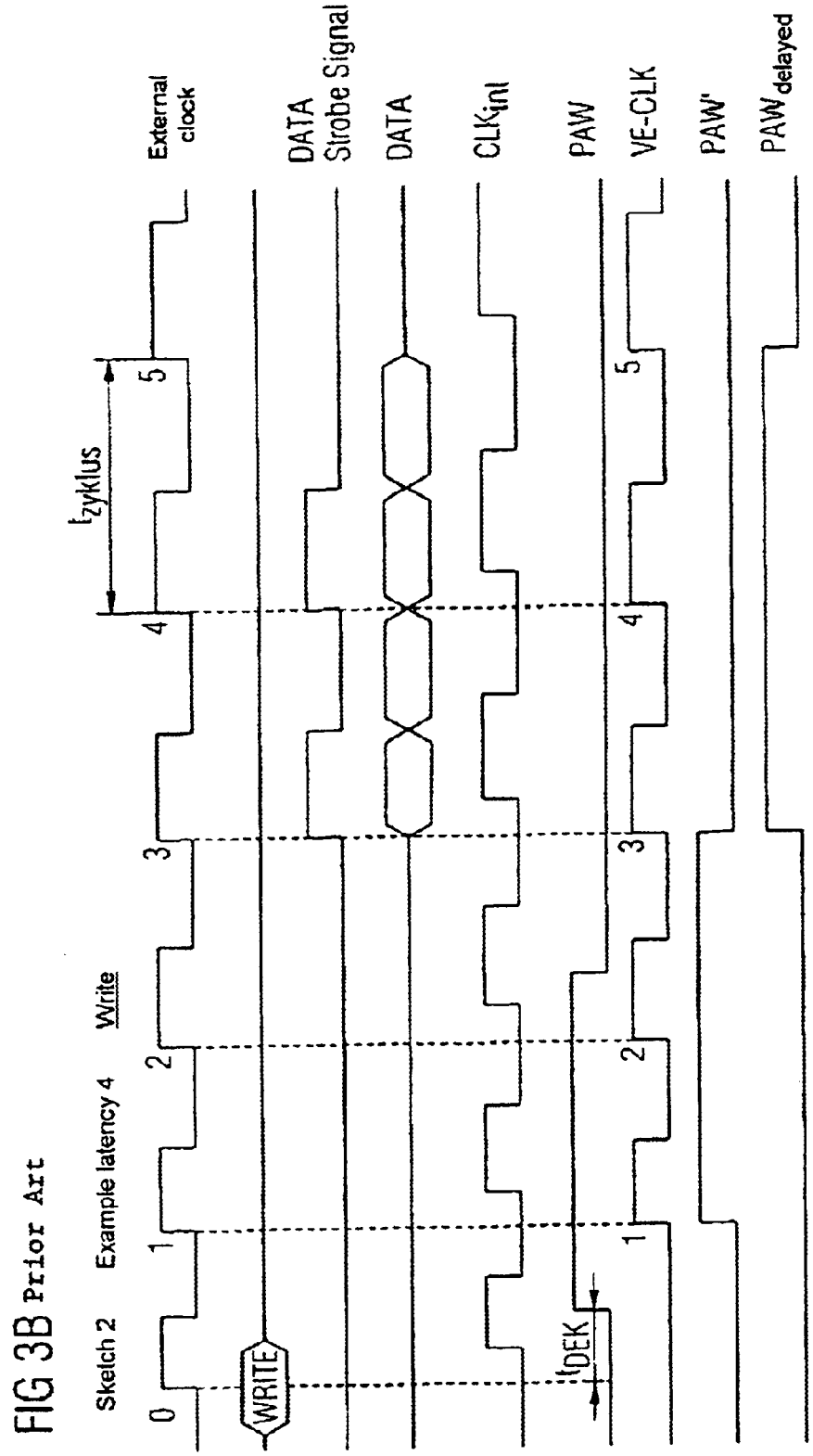

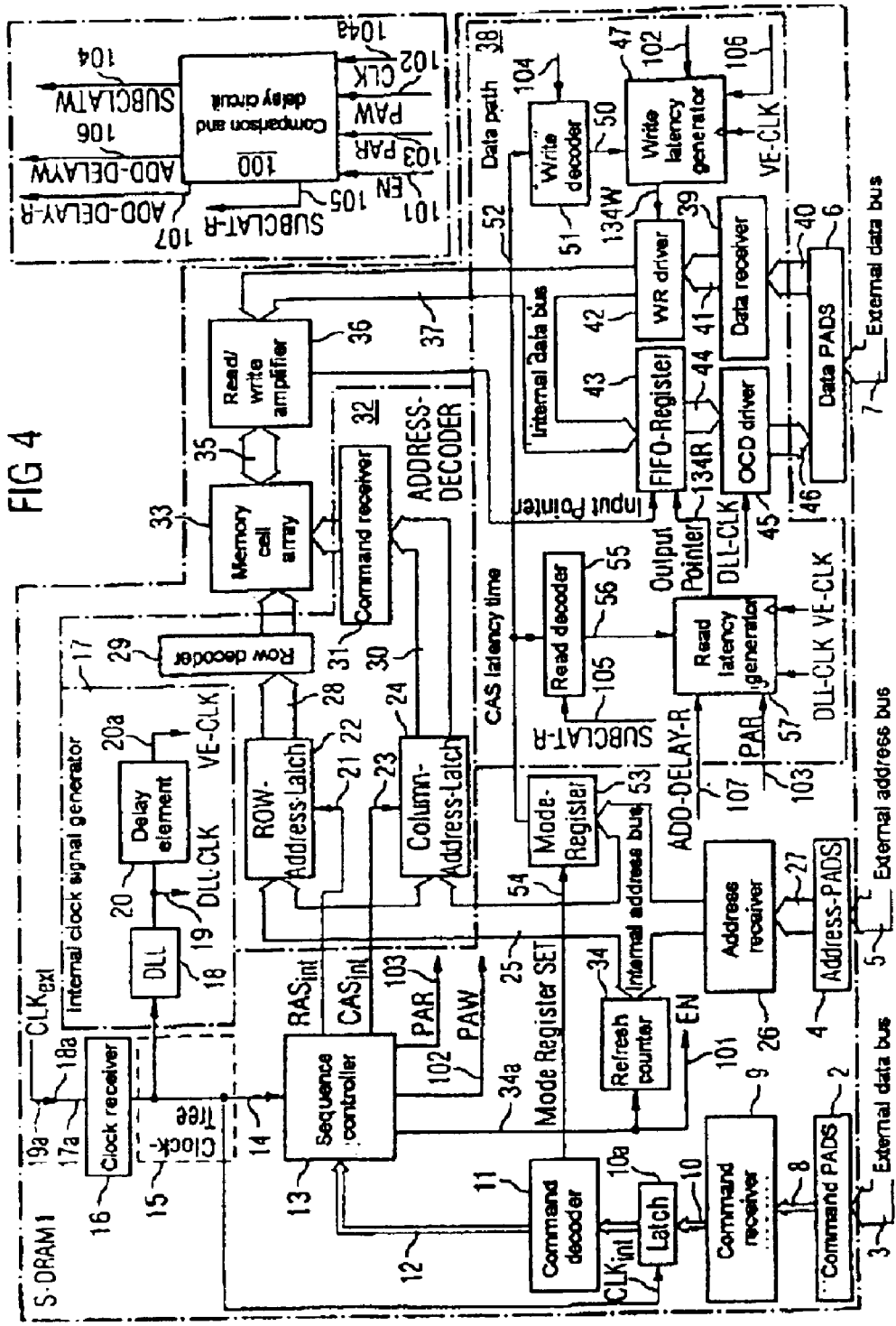

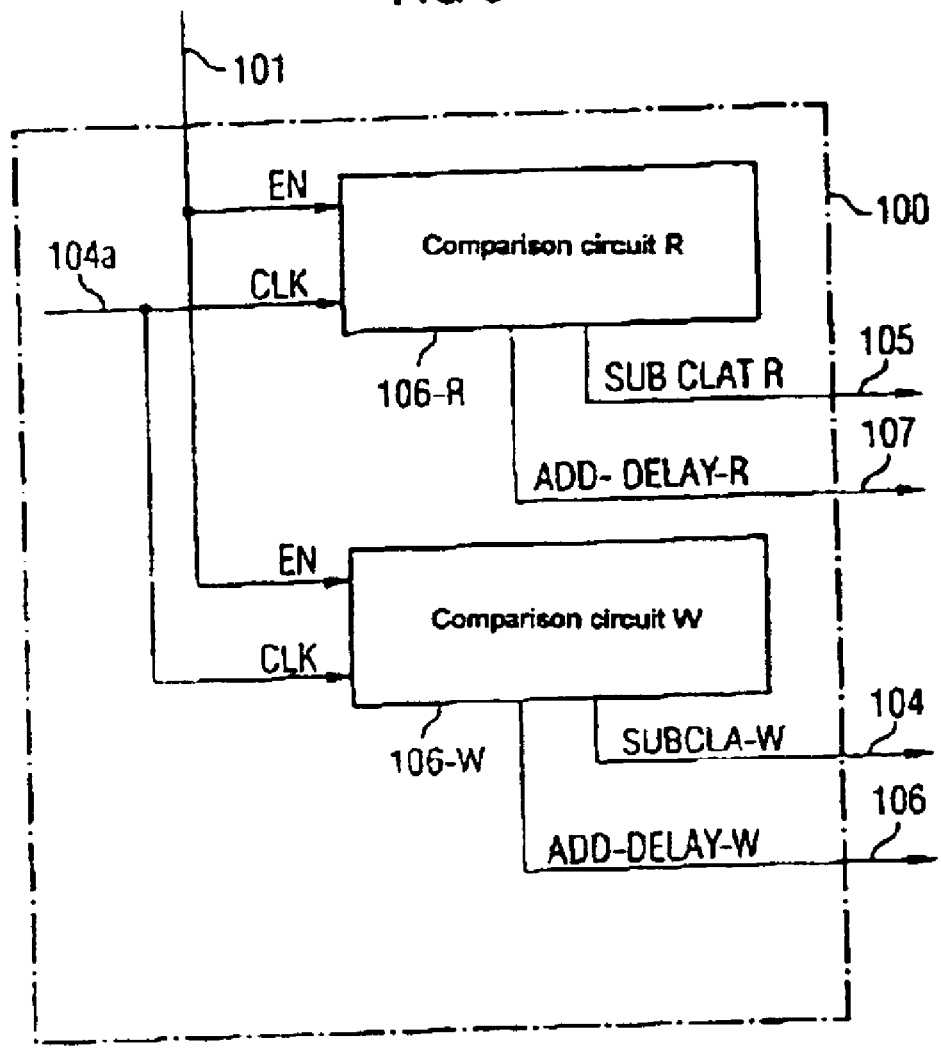

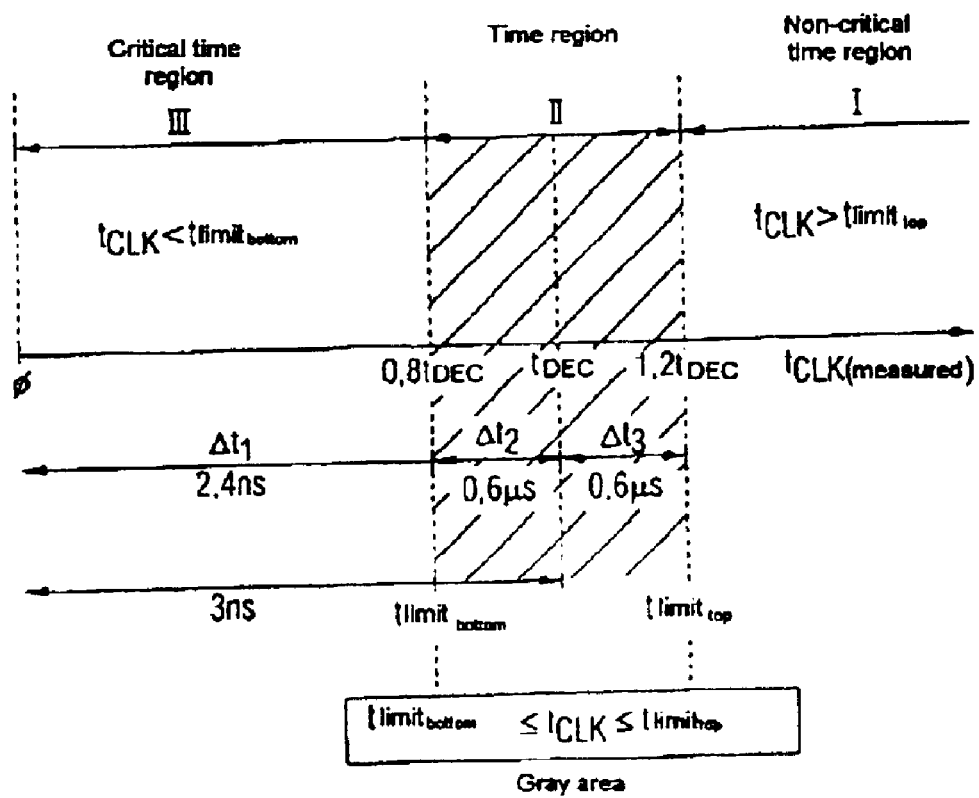

FIG 6C

| Time region | A | B | SUBCLAT | ADD-DELAY |
|---|---|---|---|---|
| I | 1 | 1 | 0 | 0 |
| II | 1 | 0 | 1 | 1 |
| III | 0 | 0 | 1 | 0 |
| ✗ | 0 | 1 | ✗ | ✗ |

SUBCLAT = $\overline{A \wedge B}$

ADD-DELAY = $A \wedge \overline{B}$

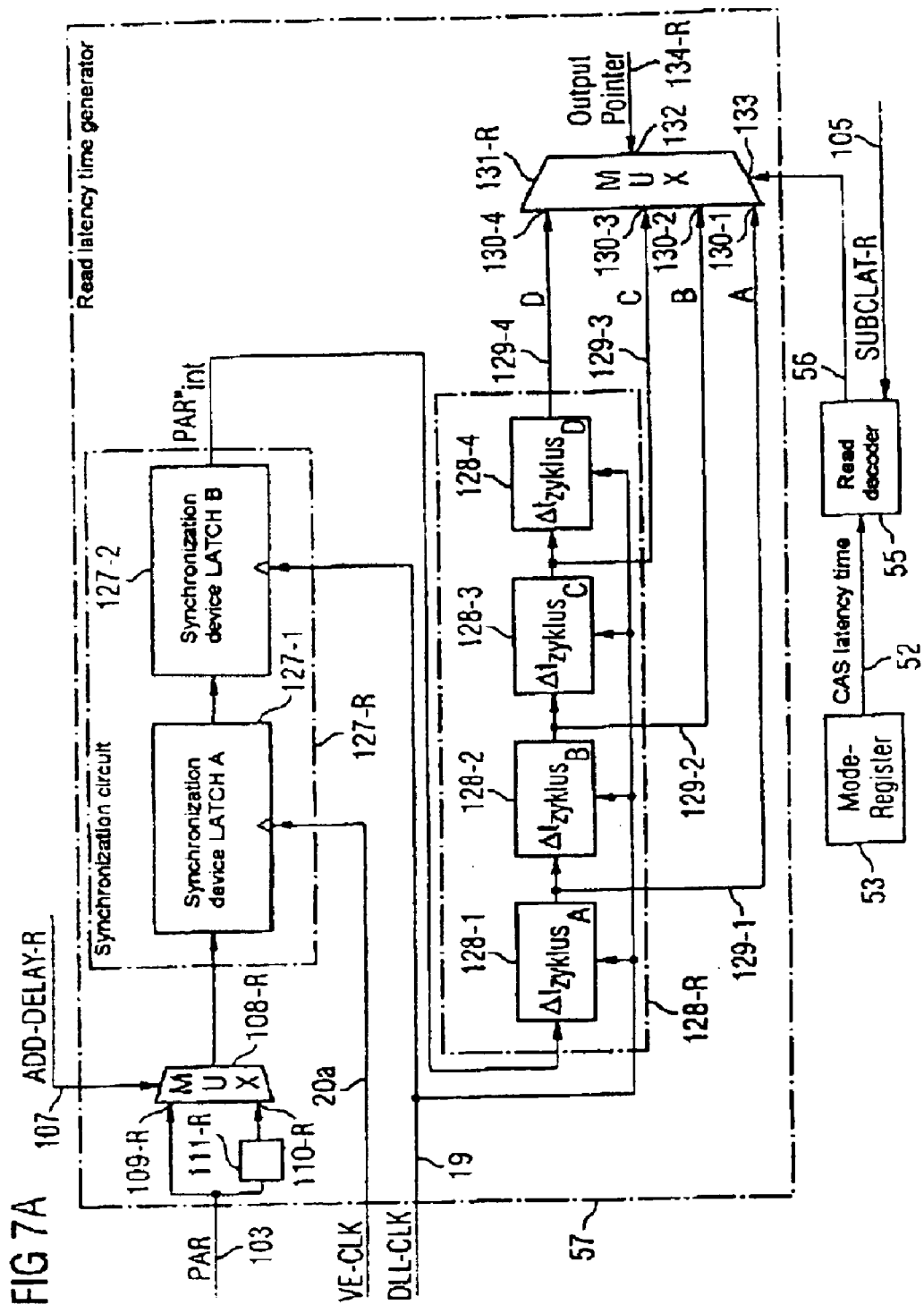

FIG 7B

Read latency time generator method of operation

| Programmable CAS latency | SUBCLAT-R | Switched multiplexer input |
|---|---|---|
| 4 | 1<br>0 | A 130-1<br>B 130-2 |
| 5 | 1<br>0 | B 130-2<br>C 130-3 |
| 6 | 1<br>0 | C 130-3<br>D 130-4 |

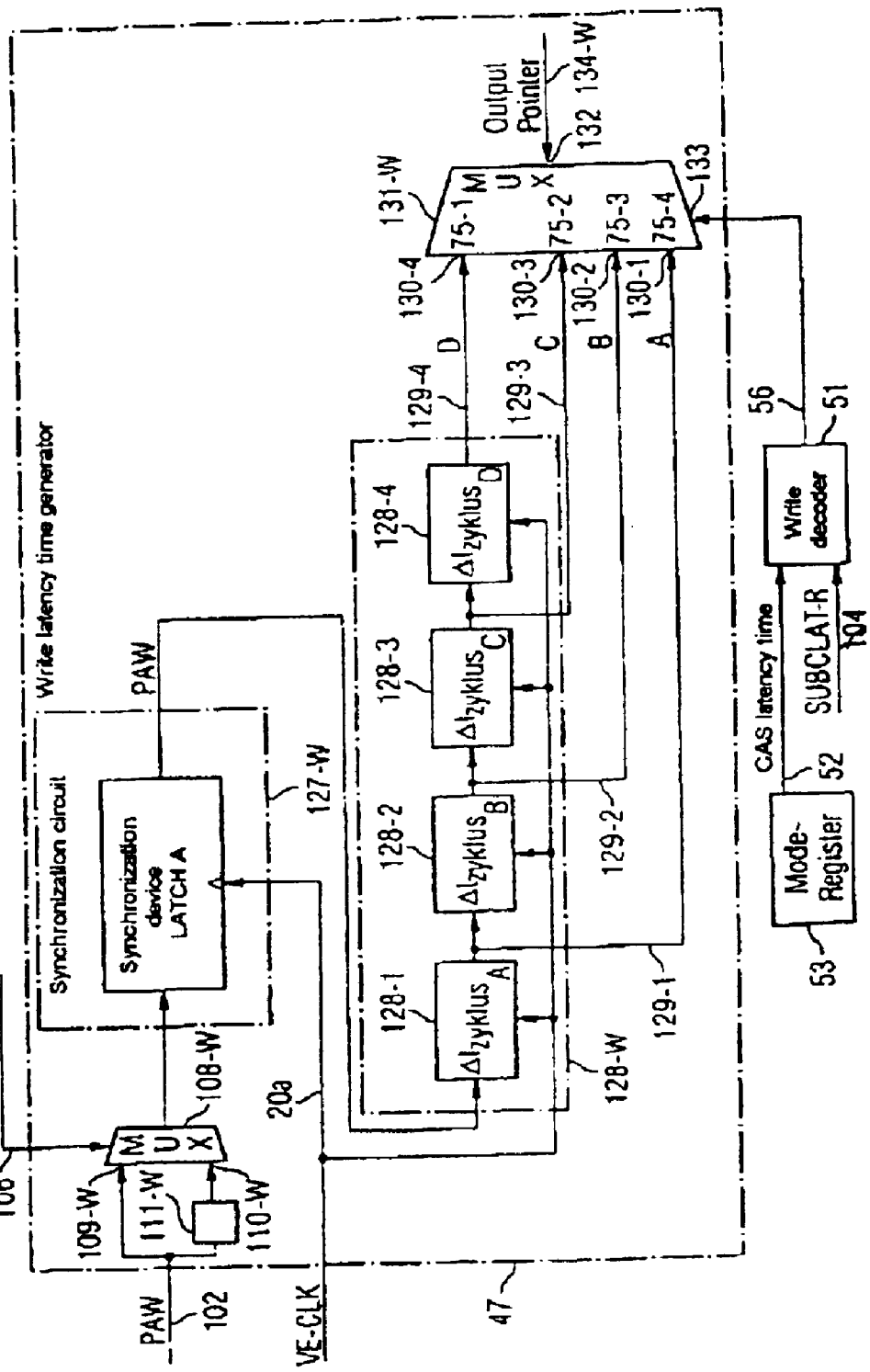

FIG 8B

Write latency time generator method of operation

| Programmable CAS latency | SUBCLAT-W | Switched multiplexer input |
|---|---|---|
| 4 | 1 | A 130-1 |
| 4 | 0 | B 130-2 |
| 5 | 1 | B 130-2 |
| 5 | 0 | C 130-3 |
| 6 | 1 | C 130-3 |
| 6 | 0 | D 130-4 |

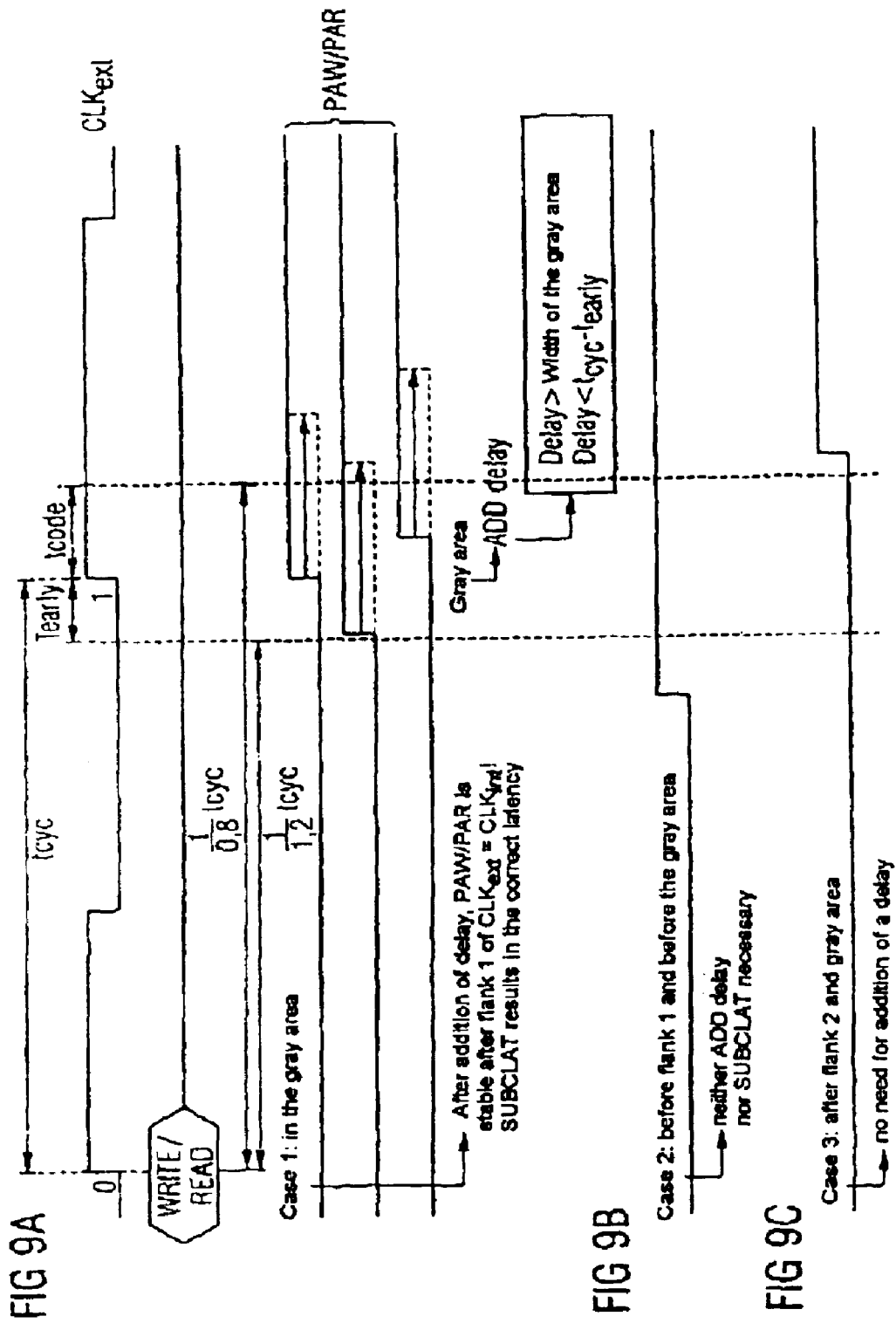

LATENCY TIME CIRCUIT FOR AN S-DRAM

CROSS REFERENCE TO RELATED APPLICATIONS

Some of what is disclosed in this application is also disclosed in U.S. application Ser. No. 10/248,874 filed on Feb. 26, 2003 by the inventors hereof, the entire disclosure of which is incorporated herein by reference.

BACKGROUND OF INVENTION

The invention relates to a latency time circuit for an S-DRAM. D-RAM modules are standard memory modules for main memories. D-RAM memories are composed of large-scale integrated transistors and capacitors. In order to obtain the information, the memory contents must be continuously refreshed in this case. A synchronous D-RAM (S-DRAM) allows memory access without any additional waiting cycles. In this case, the data is transferred between the S-DRAM and an external data bus in synchronism with the external clock signal.

FIG. 1 shows an S-DRAM memory module according to the prior art. The S-DRAM memory module is connected to an external control bus, to an external address bus and to an external data bus. The control commands which are applied to the external control bus are read in via command PADS by means of an integrated command receiver, and the received signals are applied, after signal amplification, to a command decoder. The command decoder decodes the applied control commands which, by way of example, have a length of 4 bits, to form internal control commands, for example write (WR) and read (RD). The S-DRAM contains a state machine or sequence controller which controls the internal sequences as a function of the decoded internal control commands. The sequence controller is clocked by a clock signal. For this purpose, an external clock signal $CLK_{ext}$ is applied to the S-DRAM and the signal is amplified by means of an integrated clock signal receiver. The amplified clock signal is distributed in the form of a tree in the integrated S-DRAM by means of a clock tree, and is passed via an internal clock line to a sequence controller. The external clock signal is furthermore applied to a delay locked loop DLL. The delay locked loop DLL causes a negative phase shift in the applied external clock signal CLK. The internal DLL clock signal precedes the external clock signal in order that the data is applied to the data pads in synchronism with the external clock signal. The DLL clock signal $DLL_{CLK}$ is used for clocking the output signal driver OCD (Off Chip Driver), which is integrated in the S-DRAM for one data path. The delay locked loop DLL is followed by a delay element which forms an internal clock signal (VE-CLK) which is modeled such that it is identical to the external clock signal, that is to say VE-CLK is completely in synchronism with $CLK_{ext}$. The delay element for this purpose compensates for the negative phase shift in the delay locked loop DLL.

The internal sequence controller produces control signals for the internal processing sequence of the S-DRAM as a function of the decoded commands. The sequence controller generates an RAS signal (Row Address Strobe) for driving a row address latch, and a CAS signal (Column Address Select) for driving a column address latch. The row address latch and the column address latch are connected via an internal address bus to an address signal receiver for the S-DRAM Via the external address bus, the S-DRAM receives an external address at the address PADS, with the applied address signals being amplified by an address receiver. In order to save connections, the address is entered in DRAM memories in two steps. In a first step, the row address bits are loaded into the row address latch using the RAS signal. In a second step, the column address bits are loaded into the column address latch using the CAS signal. The address bits are applied respectively to a row decoder and column decoder for access to a memory cell within the memory cell array, which is in the form of a matrix. The row address latch and the column address latch as well as the row and column decoders together form an address signal decoder. The sequence controller produces a refresh control signal in order to refresh the memory cells. A refresh counter, which receives this refresh signal from the sequence controller, produces all the existing rows or row addresses successively, which are then applied to the address bus. To do this, the sequence controller produces an RAS control signal. In this way, all the word lines are activated. Activation of a word line results in all the memory cells which are connected to it being refreshed.

The memory cell array is also connected to read/write amplifiers. The number of read/write amplifiers depends on the memory architecture, on the word length and on the prefetch. In the case of a prefetch 4 with a word length of 32, for example, 128 read/write amplifiers are in operation at the same time. If, by way of example, four independent memory banks are provided, a total of 512 read/write amplifiers are integrated on the memory chip.

One data bit is in each case written to an addressed memory cell, or is read from it, via the read/write amplifiers. The read/write amplifiers are connected via an internal data bus to an internal data path in the S-DRAM. The data in the external data bus is written synchronously via the data path to the S-DRAM and is emitted synchronously from the S-DRAM. The data path is connected to the data PADS of the S-DRAM.

In order to read data, the data path has a data receiver for receiving the externally applied data. An internal driver circuit for the data to be written (WR driver) amplifies the signals in the received data and emits the data that has been read via the internal bus to the read/write amplifiers. The driver circuit WR driver is driven by a write/latency time generator, which is clocked by the internal clock generator VE-CLK. The write/latency time generator is itself connected to a decoder.

For synchronous data emission, the data path contains a data FIFO register, which is followed by an output data driver circuit (OCD driver). The FIFO register is driven by the read/write amplifier by means of an input pointer and by a read/latency generator by means of an output pointer or a delayed data enable signal. The read/latency generator is likewise connected to a decoder.

The two decoders for the read latency time generator and for the write latency time generator are connected via internal control lines to a mode register, in which the data for controlling the operating modes is stored within the S-DRAM. The mode register can be initialized by means of a mode register set command via the internal address bus. The mode register is initialized after switch on. Before any external control commands are applied to the S-DRAM, the mode register is initialized. The mode register contains control data for the CAS latency time, for test modes and for DLL reset.

The sequence controller generates an internal write command PAW as a function of the external control commands, in order to activate the write latency time generator, and generates an internal read command PAR for activation of the read latency time generator.

An internal data path control signal PAR/PAW for the read and write latency time generators, respectively, is generated with a certain signal delay, namely for a decoding time $\Delta t_{DEC}$. This decoding time $\Delta t_{DEC}$ includes a signal delay resulting from the clock signal receiver, the clock signal line tree (clock tree), the downstream latch circuit, resulting from signal delays within the sequence controller, and resulting from signal delay times on the control lines.

$$t_{DEK} = t_{CLK_{RECEIVER}} + t_{CLK_{TREE}} + t_{Latch} + t_{CMD_{Decode}} + t_{PAR_{PRODUCTION}} + t_{control-line}$$

The generated internal read signal is applied with a short signal delay to the read/write amplifiers, which emit the data to be read out to the internal data bus. The data is passed with a further time delay $\Delta t_{FIFO}$ from the internal data bus via the FIFO register within the data path to the input of the OCD driver. The OCD driver, or data output driver, emits the data with a further signal delay $\Delta t_{OCD}$ to the data PADS of the S-DRAM. There is a delay time $\Delta T$ between the flank of the external clock signal at which the decoded internal read command RD is applied, and the data output via the data PADS.

FIG. 2a shows a latency time generator according to the prior art, which is contained in the data path of the conventional S-DRAM. The conventional latency time generator illustrated in FIG. 2a receives the internal read signal $PAR_{int}$ from the sequence controller. The internal read signal is synchronized to the DLL clock by means of a synchronization circuit, which comprises a first synchronization latch A and a second synchronization latch B. The clock signal VE-CLK is completely synchronized to the external clock signal CLK external. In a first step, PAR is synchronized to the VECLK (latch A) and, in a second step, it is synchronized to the DLL-CLK. The internal read signal $PAR_{int}$ that has been synchronized in this way is applied to a chain of series-connected time switching elements, each of which causes a delay of one clock cycle. The time switching elements are clocked by the clock signal DLL-CLK. Each of the time switching elements produces a signal delay which is identical to the cycle time of the $\Delta t_{cycle}$ of the external clock signal. cycle In the read latency time generator as illustrated in FIG. 2a and according to the prior art, the CAS latency time is stored in the mode register, in which case, by way of example, it is possible to store a CAS latency time of 6, a CAS latency time of 5 and a CAS latency time of 4 in the mode register. Memories also exist with other latency times, for example 2, 3 or 7. The read latency time or CAS latency time indicates a number of clock cycles between the application of the external read command and the appearance of the emitted data at the OCD driver. The expression read latency means the number of clock cycles which pass between application of a read command to a synchronous memory and the appearance of the requested data at the output of the memory. A short read latency has the advantage that a connected controller requires fewer waiting cycles. Depending on the lengths of the internal signal delay times, decoding times and amplifier delay times on the memory chip, a short read latency can be achieved, or longer read latency times must be accepted. One important influencing factor in this case is the quality of the production process. These process fluctuations, however, not only govern the read latencies of the memory chip but are also a main influencing factor for the capability of the memory chip to achieve high clock rates.

In order to achieve a read latency time or CAS latency time of CAS=6, the synchronized internal read signal $PAR_{int}$ is applied to the chain of timing elements and is delayed with a delay which corresponds to four times the clock cycle time $\Delta t_{cycle}$. In order to achieve a CAS latency time of 5, the synchronized internal read signal passes through only 3 timing elements, and in order to achieve a CAS latency time of 4, the synchronized internal read signal passes through only 2 timing elements. In a corresponding manner, three inputs are provided on an internal multiplexer for the latency time generator, and are connected to outputs of timing elements within the chain. The decoder decodes the desired CAS latency time, which is stored digitally in the mode register, and drives the multiplexer via a control line. If, for example, a CAS latency time of 4 is stored in the mode register, the decoder connects the third input of the multiplexer to the output control line. The multiplexer is connected on the output side to the FIFO register, and emits a delayed enable signal to the FIFO register.

FIG. 2b shows a timing diagram to explain the function of the latency time generator or latency time counter according to the prior art. The example illustrated in FIG. 2b shows the procedure for a stored CAS latency time of 4. The decoder identifies the CAS latency time of 4, and connects the third input of the multiplexer, so that a time delay is produced by two clocked timing elements. Since the timing elements are clocked by the internal clock signal DLL-CLK, the data is enabled with a time delay after the fourth rising flank of the DLL-CLK clock signal. The internal read command signal which is applied to the latency time generator is in fact passed to the latency time generator only after a time delay of $\Delta t_{DEC}$.

As the clock frequency of the external clock signal rises, the cycle time $t_{cycle}$ of the clock signal decreases. If the clock rate is 500 MHz, the cycle time $t_{cycle}$ is now only 2 ns, and is in the same order of magnitude as the signal delay times on the chip. Since the time delay $\Delta t_{DEC}$ is constant, a situation occurs when the clock signal frequency is very high in which the signal delay $\Delta t_{DEC}$ is greater than the cycle time $t_{cycle}$. If the signal delay $\Delta t_{DEC}$ is greater than the cycle time, the signal PAR is synchronized to PAR' with the second VE-CLK signal flank, instead of with the first VE signal flank.

The read latency counter according to the prior art thus switches a very high-frequency applied clock signal one counting clock cycle too late, and the S-DRAM incorrectly emits the data too late. This in turn leads to considerable malfunctions of the overall system, in particular of the microprocessor which is connected to the S-DRAM.

A further fault mechanism, which is independent of this, relates to the offset between VECLK and DLLCLK. If a time offset occurs between DLL-CLK and VE-CLK which is greater than one clock cycle time $t_{cycle}$, the synchronization of $PAR_{int}$ to $PAR_{int}$[sic] occurs with the second DLL-CLK signal flank instead of with the first DLL-CLK flank or, if the first failure mechanism has already occurred, with the DLL-CLK signal flank three of the DLL-CLK flank 2.

FIG. 3a shows the write latency time generator according to the prior art, which is contained in the data path of the conventional S-DRAM. The conventional write latency time generator which is illustrated in FIG. 3b receives an internal data path control signal (PAW) from the sequence controller. A synchronization circuit, which has only one synchronization latch A, synchronizes the internal data path control signal to the VE clock signal. This clock signal VE-CLK is completely synchronized to the external clock signal CLK external. The internal data path control signal, synchronized in this way, is applied to a chain of series-connected time switching elements, which each cause a time delay of one clock cycle. The time switching elements are clocked by the clock signal VE-CLK. Each of the time switching elements produces a signal delay which is identical to the cycle time of the $\Delta t_{cycle}$ of the external clock signal.

In the write latency time generator as illustrated in Figure 5 and according to the prior art, the CAS latency time is stored in the mode register, in which case, for example, CAS latency time of 6, a CAS latency time of 5 and a CAS latency time of 4 can be stored in the mode register. Memories also exist with other latency times, such as 2, 3 or 7.

The read latency time or CAS latency time indicates the number of clock cycles between the application of the external read command and the appearance of the output data at the OCD driver. A low read latency CAS has the advantage that a connected controller requires fewer waiting cycles. A short read latency CAS can be achieved, or longer read latency times must be accepted, depending on the length of the internal signal delay times, decoding times, and amplifier delay times on the memory chip. One important influencing factor in this case is the quality of the production process. However, these process fluctuations govern not only the read latencies CAS of the memory chip, but are also a main influencing factor for the capability of the memory chip to achieve high clock rates.

The expression write latency means the number of clock cycles which pass between the application of a write command and the application of the data to the inputs of the memory chip. The read latency time CAS for conventional S-DRAMs can be programmed into a mode register. The write latency in the case of the DDR2 Standard is coupled to the read latency CAS and is one clock cycle less than the read latency.

Write latency=read latency−1.

As can be seen from FIG. 3a, a CAS latency of 4 corresponds to a write latency of 3, and to a time delay of $2\Delta t_{cycle}$ by means of two timing elements of the write latency time generator.

FIG. 3b shows a writing process for an S-DRAM with a stored CAS latency time of 4. A write command WRITE is applied and is decoded during the clock cycle 0 of the external clock signal. The sequence controller generates an internal time control signal, which is generated with a certain signal delay, namely with the decoding time $\Delta t_{DEC}$. This decoding time includes a signal delay resulting from the clock signal receiver, the clock signal line tree, the command decoding and resulting from signal delays within the sequence controller. As the clock frequency of the external clock signal rises, the cycle time $t_{cycle}$ of the clock signal decreases. Since the time delay $\Delta t_{DEC}$ is constant, a situation occurs with a very high-frequency clock signal in which the signal time delay $\Delta t_{DEC}$ is greater than the cycle time $t_{cycle}$. In this situation, the PAW control signal can no longer be received with the signal flank 1 of the VE-CLK as illustrated in FIG. 4b, but only with the signal flank 2 of the VE-CLK clock signal. This means that the synchronization of the internal write signal PAW to PAW' by means of the synchronization circuit within the write latency time generator incorrectly takes place delayed by one entire signal clock cycle, that is to say with the signal clock cycle 2 instead of with the signal clock cycle 1. If the clock cycle time thus decreases as a result of an excessively high clock frequency into the time region of the decoding time, then there is no longer any guarantee that the write data path within the S-DRAM will be switched on in a stable manner.

In order to avoid the malfunction as described above of the write latency circuit according to the prior art, attempts have already been made to minimize the signal delay times, in order to reduce the delay time $\Delta t_{DEC}$.

However, at very high clock frequencies, minimizing the signal delay times reaches its limits, and is no longer sufficient to prevent a malfunction.

SUMMARY OF INVENTION

The object of the present invention is thus to provide a latency time circuit for an S-DRAM which operates in a fault-free manner even with a very high-frequency clock signal, that is to say it emits a data enable signal with the desired latency time to the data path.

This object is achieved by a latency time circuit having the features described herein.

The invention provides a latency time circuit for an S-DRAM which is clocked by a high frequency clock signal, for producing a delayed data enable control signal for synchronous data transfer through a data path of the S-DRAM having: at least one controllable latency time generator for delaying a decoded data enable control signal with an adjustable latency time, wherein at least one comparison circuit, which compares the cycle time of the high-frequency data signal with a predetermined decoding time and having a signal delay circuit which can be switched on by means of the comparison circuit in order to delay the decoded data enable control signal with a predetermined delay time, in which the signal delay circuit is switched on by the comparison circuit when the cycle time of the clock signal is in a limit time region which is located about the predetermined decoding time.

In one preferred embodiment of the latency time circuit according to the invention, the comparison circuit reduces the latency time, which is generated by the latency time generator, by one cycle time when the cycle time of the clock signal is in the limit time region.

In one preferred embodiment of the latency time circuit according to the invention, the comparison circuit reduces the latency time which is generated by the latency time generator by one cycle time when the cycle time of the clock signal is in a critical time region below the limit time region.

A mode register is preferably provided for storing a programmable latency time.

Furthermore, a decoder is preferably provided, which decodes the programmed latency time CAS in order to produce an internal control signal for the latency time generator.

The comparison circuit preferably emits a correction control signal to the decoder when the cycle time of the clock signal is in the limit time region or in the critical time region.

The controllable latency time generator preferably has a number of series-connected time switching elements, which each pass on a signal which is applied to a signal input to their signal output, delayed by the cycle time.

The signal outputs of the time switching elements are in this case each connected to one signal input of a controllable multiplexer within the latency time generator.

The multiplexer preferably has a control input for the internal control signal which is emitted by the decoder.

The signal delay of all the series-connected time switching elements is preferably equal to a maximum programmable latency time minus two.

In the absence of the correction indication control signal, the decoder drives the multiplexer such that the signal delay which is produced by the time switching elements is equal to the programmable latency time reduced by two cycle times.

On receiving the correction indication control signal, the decoder preferably furthermore drives the multiplexer such that the signal delay produced by the time switching elements is reduced by one cycle time.

The latency time generator of the latency time circuit according to the invention preferably has a synchronization circuit for synchronization of the decoded data enable control signal to an internal clock signal.

In one particularly preferred embodiment of the latency time circuit according to the invention, the comparison circuit preferably has a test signal generator for producing a test signal; a delay circuit, which comprises at least one series-connected delay element, for delaying the test signal which is produced, a clocked clock pulse generator for producing a clock pulse whose pulse duration is equal to the cycle time of the clock signal, at least one associated transfer gate circuit with an input for application of the delayed test signal, a clock input for application of the clocked clock signal and having an output to which the delayed test signal which is produced is passed on when the delay time of the delay circuit is shorter than the pulse duration of the clock pulse which is produced by the clock pulse generator, and a latch circuit for temporary storage of the passed-on delayed test signal, in which one signal output of a delay element is in each case connected through an associated transfer gate circuit to a latch circuit.

The test signal is preferably a logic-high signal pulse with a long pulse duration.

The test signal which is preferably passed on is temporarily stored as a correction indication bit in the latch circuit.

The delay circuit preferably comprises a first delay element having a first signal delay time, and a series-connected second delay element having a second signal delay time, with the sum of the two signal delay times being equal to the predetermined decoding time.

The delay circuit preferably has a third delay element with a third signal delay time, with the third signal delay time being equal to the difference between the predetermined decoding time and the first signal delay time.

The comparison circuit preferably and additionally has a logic circuit, which logically links the temporarily stored correction indication bits to the first correction control signal in order to drive a multiplexer, and to the second correction control signal in order to drive the decoder.

After receiving an enable signal from the internal sequence controller of the S-DRAM, the test signal generator preferably produces the test signal.

Preferred embodiments of the latency time circuit according to the invention will be described in the following text with reference to the attached figures in order to explain features which are significant to the invention.

BRIEF DESCRIPTION OF DRAWINGS

FIG. 2b shows timing diagrams of a read process for an S-DRAM according to the prior art.

FIG. 3b shows flowcharts of a write process for an S-DRAM according to the prior art.

FIG. 4 shows a block diagram of an S-DRAM according to the invention.

FIG. 5 shows a block diagram of a comparison and delay circuit which is contained in the latency time circuit according to the invention.

FIG. 6b shows a timing diagram to explain the method of operation of the latency time circuit according to the invention.

FIG. 6c shows a table to explain the method of operation of one preferred embodiment of the latency time circuit according to the invention.

FIG. 7a shows a block diagram of a read latency time generator which is contained in the latency time circuit according to the invention.

FIG. 7b shows a table to explain the method of operation of the read latency time generator according to the invention.

FIG. 8a shows a block diagram of a write latency time generator which is contained in the latency time circuit according to the invention.

FIG. 8b shows a table to explain the method of operation of the write latency time generator according to the invention.

FIG. 9 shows timing diagrams to explain the method of operation of the latency time circuit according to the invention.

DETAILED DESCRIPTION

Figure 1:
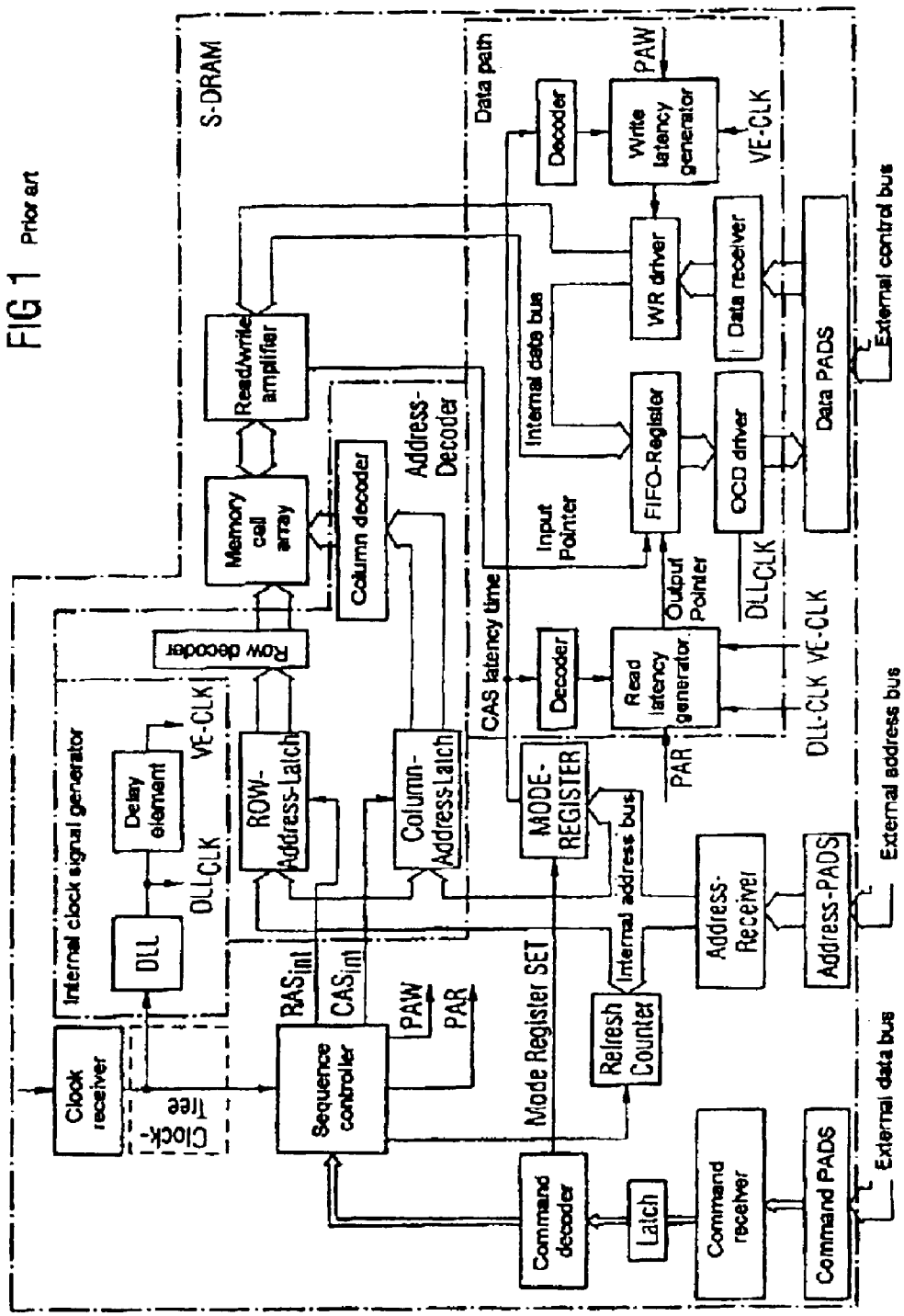
FIG. 1 shows a block diagram of an S-DRAM according to the prior art.

As can be seen from FIG. 4, the S-DRAM has command PADS 2 for connection to an external control bus 3. Furthermore, the S-DRAM 1 is connected via address PADS 4 to an external address bus 5, and via data PADS 6 to an external data bus 7. Via the command PADS 2 the S-DRAM receives external control commands, which are applied to a control command receiver 9 via internal lines 8. The received external control commands are applied via internal lines 10 and a latch circuit 10a to a command decoder 11, for decoding. The command decoder 11 decodes the external control commands and generates internal control commands such as read (RD) or write (WR), which are emitted via internal control lines 12 to an integrated state machine or sequence controller 13 for the S-DRAM 1. The sequence controller 13 uses the control commands to generate sequence control commands for controlling the internal sequences of the S-DRAM 1.

The sequence controller 13 receives (via a clock signal line 14) an internal clock signal which is emitted from a clock signal receiver 16 via a clock signal line tree 15. The clock signal receiver 16 is connected via a clock line 17a to a clock signal PAD 18a in order to receive an external main clock signal CLK external via an external clock signal line 19a. The received external clock signal is also passed via the clock signal line tree 15 to an internal clock signal generator circuit 17 within the S-DRAM 1. An internal clock signal DLL-CLK is first of all produced in a delay locked loop 18, with a negative phase shift in comparison to the external clock signal. The negative phase shift in this case preferably corresponds essentially to the data signal time delay of the data path. The internal clock signal DLL-CLK which is produced is emitted via an internal clock signal line 19. The DLL circuit 18 is followed by a delay element 20, which produces the clock signal VE-CLK, which is synchronized completely to the external clock signal CLK external. The synchronous internal clock signal VE-CLK is emitted via a clock signal line 20a.

The internal sequence controller 13 produces an internal RAS signal, which is emitted via a control line 21 to a row address latch 22. The sequence controller 13 furthermore generates an internal CAS signal, which is emitted via a line 23 to a column address latch 24. The row address latch circuit 22 as well as the column address latch circuit 24 are connected via an internal bus 25 to the output of an address signal receiver 26, which receives via internal lines 27 the external address signal which is applied to the address signal PADS 4.

The row address latch circuit 22 is connected via internal address lines 28 to a row decoder 29, and the column address latch circuit 24 is connected via internal address lines 30 to a column decoder 31. The two latch circuits 22, 24 and the two decoders 29, 31 together form an address decoder 32 within the S-DRAM. Memory cells within a memory cell array 33 are addressed by means of the address decoder 32. The memory cells are refreshed at regular time intervals by means of a refresh control command, which is generated by the sequence controller 13. A refresh counter 34 thus receives an appropriate refresh command from the sequence controller 13 via a refresh control line 34a.

The memory cell array 33 is also connected via internal data lines 35 to read/write amplifiers 36. The read/write amplifiers 36 are connected via an internal data bus 37 to a data path 38 within the S-DRAM 1. The data path 38 ensures that data is transmitted synchronously to the external data bus 7.

The data path 38 is used for writing data and for outputting data.

A data receiver 39 receives external data, which is to be written to the data PADS 6, via internal data lines 40. The received data is passed via data lines 41 to a driver circuit 42, whose output side is connected to the internal data bus 37.

Conversely, the data to be emitted is applied via the internal data bus 37 to a FIFO register 43, and is passed via data lines 44 to an output data driver 45. The output data driver 45 OCD (Off Chip Driver) emits the data to be emitted via data lines 46 to the data PADS 6.

In order to write data in a synchronized manner, the driver circuit 42 contains [sic] an enable signal from a write latency time generator 47 via a control line 134-W. The write latency time generator 47 receives an internal write command signal PAW, which comes from a PAR/PAW from 13 and is passed only to the latency time generator 57/47, via a control line 102. The write latency time generator 47 is furthermore connected via lines 50 to a write decoder 51, which decodes the operating mode data that is applied to an internal control bus 52. The internal control bus 52 is used for reading operating mode data that is stored in an operating mode register 53.

The operating mode register 53 can be initialized via the internal address bus 25. To do this, on receiving a corresponding external control command, the command decoder 11 generates a mode register set command, which is applied to the mode register 53 via a control line 54. The mode register 53 reads the operating mode data which is applied to the internal address bus 25 at that time, and stores it.

The internal control bus 52 is furthermore connected to a read decoder 55, which decodes the operating mode data that is applied to the internal control bus 52, and drives a read latency time generator 57 via a control line 56. The read latency time generator 57 receives (via a control line 58) an internal read command signal PAR, which is emitted by the sequence controller 13.

The comparison and delay circuit 100 receives an enable control signal EN from the sequence controller 13 via a control line 101. This enable control signal EN is preferably tapped off from the refresh control signal for the refresh counter 34. The sequence controller 13 generates an internal data path control signal (PAW) for the data write path within the data path 38, and emits this via a line 102. Furthermore, the sequence controller 13 generates a read command control signal (PAR) for the read data path within the data path 38, and emits this read command control signal (PAR) via a control signal line 103. The comparison and delay circuit 100 is supplied with the clock signal CLK via a clock signal line 104a. The comparison and delay circuit 100 compares the cycle time ($t_{cycle}$) of the applied clock signal CLK, that is to say the cycle time of the high-frequency clock signal that is applied to the S-DRAM with the necessary decoding time $\Delta t_{DEC}$.

The decoding time is an undesirable but unavoidable delay time within the S-DRAM chip. The decoding time is made up of the signal delay resulting from the clock signal receiver 16, from the clock signal line tree 15, from the delay resulting from the latch circuit 10a, from the signal delay of the command receiver 11, from the signal delay within the sequence controller 13 and the line delay time on the internal control lines 102 and 103.

$$\Delta t_{DEC} = t_{receiver} + t_{clock\ tree} + t_{latch} + t_{decoder} + t_{sequence\ controller} + t_{control\ line}$$

If the clock frequency of the applied clock signal increases, then the cycle time $t_{cycle}$ falls in a corresponding manner, so that the cycle time enters the range of the decoding time $\Delta t_{DEC}$.

The comparison and delay circuit 100 compares the determined cycle time $t_{cycle}$ of the high-frequency clock signal with the predetermined decoding time. If the cycle time $t_{cycle}$ of the clock signal enters a critical time region, that is to say the time region of the decoding time, the comparison and delay circuit generates a correction control signal (add delay) and connects a signal delay circuit into the control signal path, by means of a multiplexer. In this situation, the comparison and delay circuit 100 additionally delays the data enable control signal for the latency time generators 47, 57. If it were not compensated for, this additional time delay would lead to the S-DRAM undoubtedly not functioning. The comparison and delay circuit thus at the same time drives the write decoder 51 and the read decoder 55 via control lines 104, 105 in order to reduce the generated latency time of the associated latency time generator 47 or 57 by one cycle time $t_{cycle}$ of the clock cycle CLK. To do this, the comparison and delay circuit 100 generates a second correction control signal SUBCLAT, and applies this via the control lines 104, 105 to the write decoder 51 and to the read decoder 55, respectively.

FIG. 5 shows a block diagram of the comparison and delay circuit 100. The comparison and delay circuit 100 contains a comparison circuit in each case both for the read signal path and for the write signal path. The comparison circuit 106-R for the read signal path (R) and the comparison circuit 106-W for the write signal path (W) each receive the enable control signal EN from the sequence controller 13, and the internal clock signal CLK.

The comparison circuit 106-R compares the cycle time $t_{cycle}$ of the applied clock signal CLK with the known decoding time for the read control signal PAR. If the cycle time $t_{cycle}$ of the clock signal CLK enters a limit time region, which is located around the known decoding time $\Delta t_{DEC}$, the comparison circuit 106-R generates a first correction control signal add delay (add delay-R=1) for the read signal path R.

The comparison circuit 106-R produces a further correction control signal (SUBCLAT-R=1) for the read decoder 55 when the cycle time $t_{cycle}$ of the clock signal enters the critical limit time region of the decoding time.

The comparison circuit 106-W for the write signal path in the data path 38 operates in the same way as the comparison circuit 106-R for the read signal path. If the cycle time of the applied clock signal CLK is in the limit time region around the known decoding time $\Delta t_{DEC}$ of the write control signal PAW, the first correction indication control signal (add delay-W=1) is generated. At the same time, a second correction control signal SUBCLA-W is generated for the write latency generator 47.

Figure 6A:
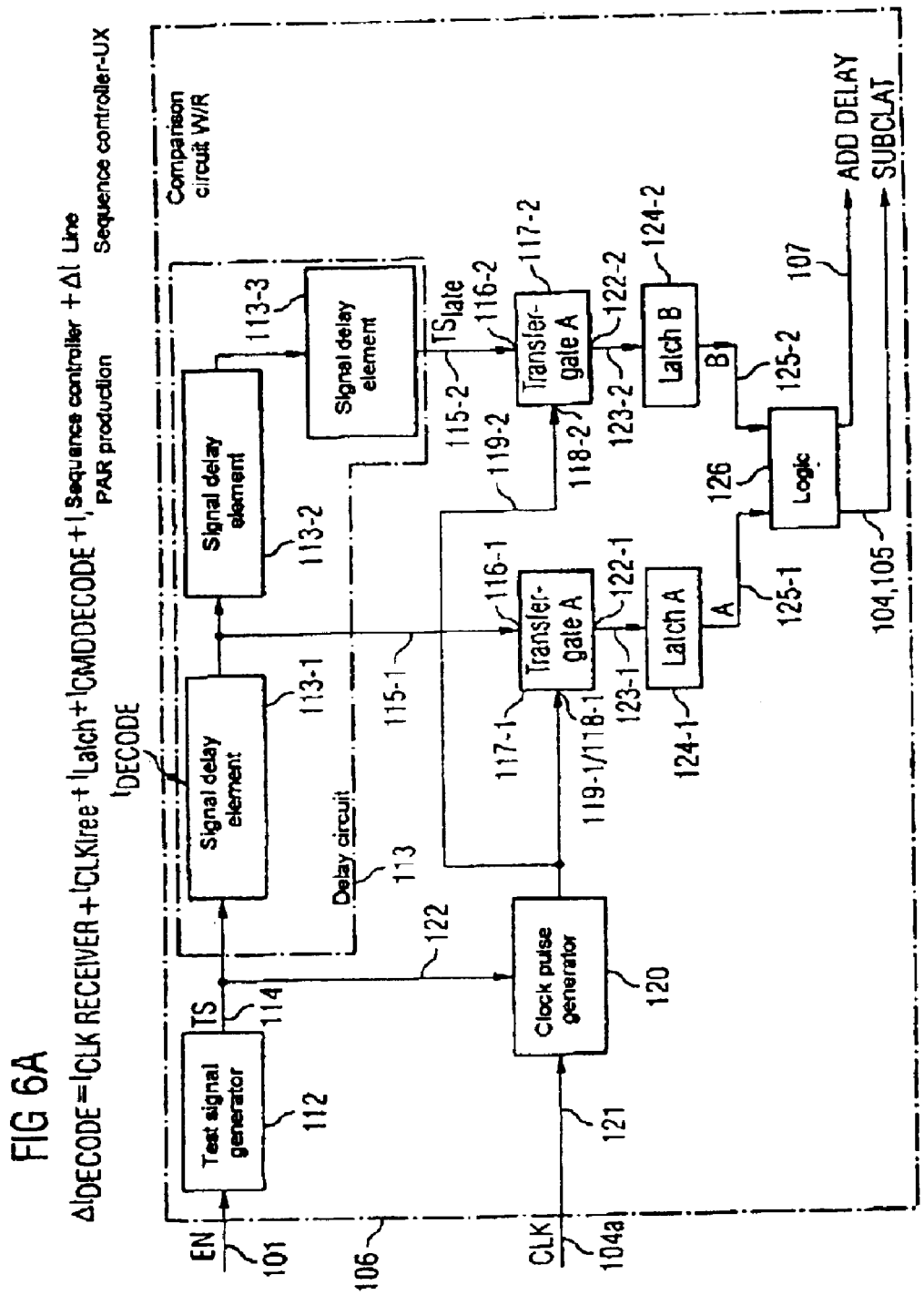
FIG. 6a shows a block diagram of the comparison circuit which is contained in the comparison and delay circuit 100.

FIG. 6a shows a particularly preferred embodiment of the comparison circuits 106-R and 106-W within the comparison and delay circuit 100.

The comparison circuit 106 contains a test signal generator 112 for producing a test signal TS, which is preferably a logic-high signal pulse with a long pulse duration. The comparison circuit 106 furthermore contains a delay circuit 113 with series-connected delay elements 113-1, 113-2 and 113-3. The delay circuit 113 receives the generated test signal TS via a signal line 114 and, with an appropriate time delay, emits it via signal lines 115-1, 115-2 to signal inputs 116-1, 116-2 of transfer gate circuits 117-1, 117-2. The transfer gate circuits 117 each have a clock signal input 118-1, 118-2, which are connected via clock signal lines 119-1, 119-2 to the signal output of a clock pulse generator 120. The clock pulse generator 120 is clocked by the clock signal via an internal clock signal line 121 and produces a clock pulse whose pulse duration is equal to the cycle time $t_{cycle}$ of the clock signal CLK. The clock pulse generator 120 is stimulated by the test signal TS via a line 122, and generates the clock pulse. The clock pulse is passed via the lines 119 to the transfer gate circuits 117 and opens the two transfer gate circuits 117 for exactly the period of one clock cycle or for the period of one cycle time $t_{cycle}$.

The signal delay element 113-1 delays the applied test signal TS by a first signal delay time $\Delta t1$. If the first signal delay time $\Delta t1$ is shorter than the clock cycle time $t_{cycle}$, the delayed test signal TS (which is applied to the signal input 116-1 of the first transfer gate circuit 117) is passed on through the transfer gate circuit 117-1 to its signal output 122-1. The test signal TS which is passed on is temporarily stored via an internal line 123-1 in a latch circuit 124-1, as an indication bit A.

The signal delay elements 113-2 and 113-3 delay the applied test signal TS further by a signal delay time $\Delta t2$ or $\Delta t3$, respectively. If the signal delay $\Delta t=\Delta t1+\Delta t2+\Delta t3$ resulting from the three series-connected signal delay elements 113-1, 113-2, 113-3 is shorter than the measured cycle time $t_{cycle}$ of the applied clock signal CLK, the further-delayed test signal TS ($TS_{late}$) is also passed to the transfer gate circuit 117-2 within the pulse duration of the clock pulse which is generated by the clock pulse generator 120, at the output 122-2 of the transfer gate 117-2. The test signal TS which is passed on is temporarily stored via an internal line 123-2 in a latch circuit 124-2, as an indication bit B.

On the output side, the two latch circuits 124-1, 124-2 are connected via lines 125-1, 125-2 to a downstream logic circuit 126. The logic circuit 126 links the applied correction indication bits A, B to form a first correction control signal (add delay) and a second correction control signal SUBCLAT.

FIG. 6b is intended to illustrate the method of operation of the comparison circuit 106, as is illustrated in FIG. 6a. The signal delay elements 113-1, 113-2, 113-3 each have signal delay times, which define three time regions.

The sum of the two signal delay times of the signal delay elements 113-1 and 113-2 is preferably equal to the known decoding time $\Delta t_{DEC}$ of the data path control signal.

$$t_{DEC}=\Delta t1+\Delta t2$$

The signal delay time $\Delta t3$ of the third signal delay element 113-3 is preferably equal to the difference between the decoding time $\Delta t_{DEC}$ and the signal delay time of the first signal delay element 113-1.

$$\Delta t3=t_{DEC}-\Delta t1$$

The signal delay time $\Delta t2$ of the second signal delay element 113-2 is preferably equal to the signal delay time of the signal delay element 113-3.

For example, the signal delay time of the first signal delay element 113-1 is chosen such that it amounts to 80% of the known decoding time $\Delta t_{DEC}$. The signal delay time $\Delta t2$ of the second signal delay element 113-2 is in this case 20% of the known decoding time $\Delta t_{DEC}$. The signal delay time $\Delta t3$ of the third signal delay element 113-3 is likewise preferably designed to be 20% of the known decoding time $\Delta t_{DEC}$.

A typical decoding time $\Delta t_{DEC}$ is about 3 nanoseconds. In this case, the signal delay of the first signal delay element 113-1 is 2.4 nanoseconds, the signal delay time of the second signal delay element 113-2 is 0.6 nanoseconds, and the signal delay time of the third signal delay element 113-3 is likewise 0.6 nanoseconds.

If the cycle time $t_{DEC}$ of the measured clock signal CLK is long, that is to say the clock frequency of the applied clock signal is relatively low, the clock signal is in the non-critical time region I. In this case, the comparison circuit 106, as is illustrated in FIG. 6a, generates a logic low first correction control signal (add delay=0), and a logic-low second correction control signal (SUBCLATT=0). This is also shown in tabular form in FIG. 6c.

If the clock frequency of the applied clock signal CLK is very high and the applied cycle time is accordingly very short, the clock signal is in the critical time region III, in which a correction by the latency time generator will invariably be required. In this situation, the comparison circuit 106 generates a logic-high second correction control signal (SUBCLAT=1) and a logic-low second correction control signal (add delay=0), as is shown in FIG. 6c.

If the cycle time $t_{cycle}$ of the measured applied clock signal CLK is in a limit time region II, that is to say it is close to the decoding time $\Delta t_{DEC}$, the comparison circuit 106 generates both a logic-high first correction control signal (add delay=1) and a second logic-high correction control signal (SUBCLAT=1). The first correction control signal (add delay=1) switches the multiplexer in the latency time generator, and delays the applied control signal deliberately. This means that the data path control signal invariably arrives too late, although this is compensated for by the logic-high second correction control signal (SUBCLAT=1) for driving the latency time generator.

Figure 2A:
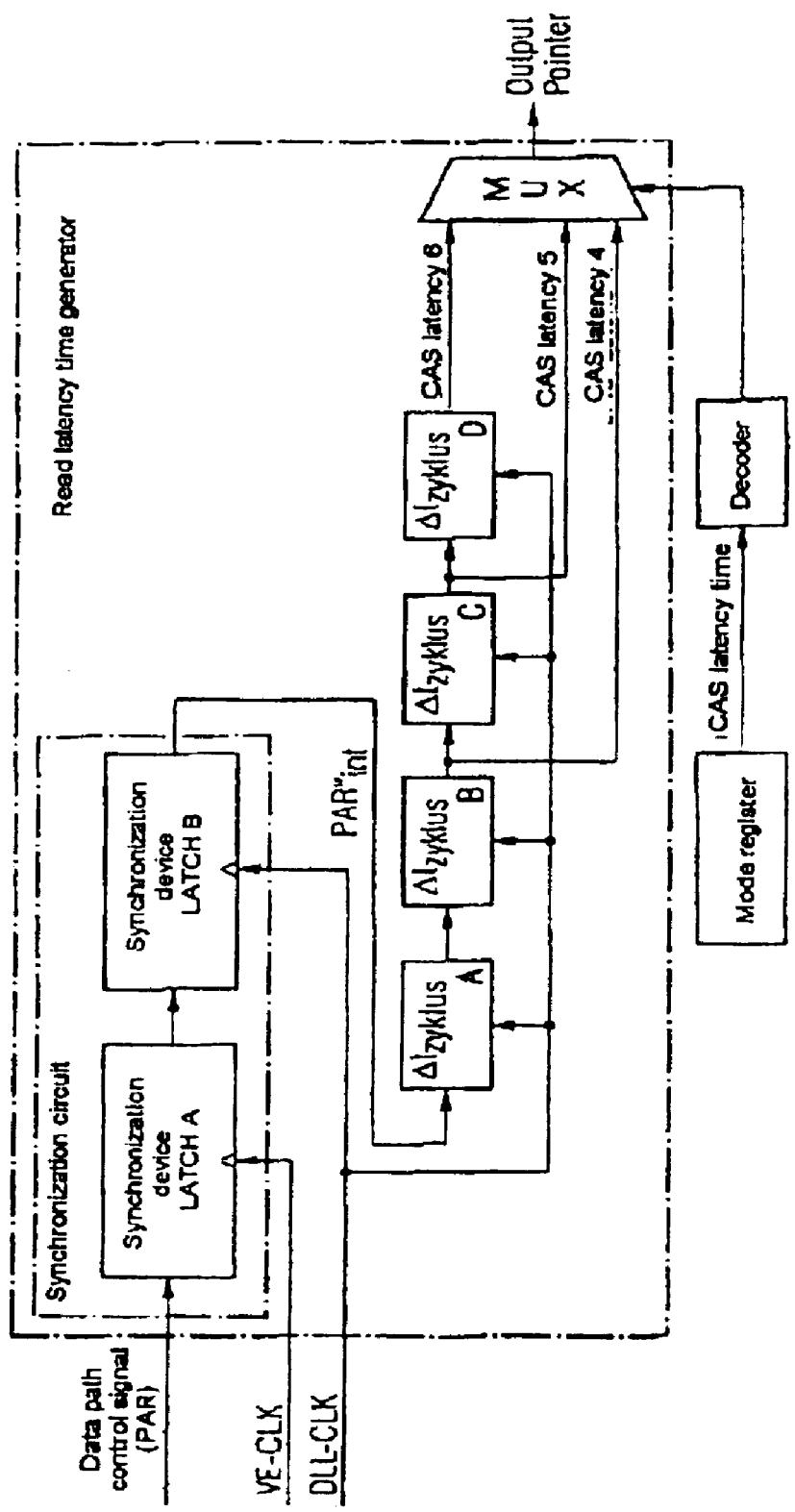
FIG. 2a shows a read latency time generator according to the prior art.

FIG. 7a shows a read latency time generator 57, as is provided in the latency time circuit according to the invention. The read latency time generator 57 is largely identical to the read latency time generator according to the prior art, as is illustrated in FIG. 2a. The read latency time generator 57 contains a synchronization circuit 127 with a first synchronization latch 127-1 and with a second synchronization latch 127-2. The synchronization circuit 127 is used for synchronization of the read control signal PAR, which is emitted from the sequence controller 13, to the clock signal DLL-CLK. In the same way as the conventional read latency time generator, the read latency time generator 57 contains a chain 128 of delay elements 128-1 to 128-4. The signal outputs of the time delay elements. 128-*i* are respectively connected via a tap-off line 129-*i* to an input 130-*i* of a multiplexer 131. The multiplexer 131 has a signal output 132 and a signal input 133. The signal output 132 of the multiplexer 131 emits the data enable control signal, which has been delayed by the latency time, via the control line 133 to the FIFO register 43 in order to transfer data to the OCD driver 45.

The comparison circuit 106-R drives a multiplexer 108-R via the control line 107. The multiplexer 108-R has a first signal input 109-R and a second signal input 110-R and is switched between the two signal inputs as a function of the applied control signal. The signal input 110-R is preceded by a signal delay circuit 111-R. The internal control signal PAR coming from the sequence controller 13 is delayed by the signal delay circuit 111-R when the read latency time generator 57 receives a corresponding first correction control signal add delay (add delay-R=1) via the control line 107. The delayed internal control signal PAR is then supplied to the synchronization circuit 127-R of the read latency time generator 57.

Table 7*b* shows the method of operation of the read latency time generator 57 illustrated in FIG. 7*a*. When the read decoder 55 receives the second correction control signal SUBCLAT-R via the control line 105 from the comparison and delay circuit 100, the multiplexer 131 is switched such that the signal delay produced by the delay element chain 128 is reduced by one cycle time, that is to say the multiplexer is switched to a tap that is one cycle time earlier in the chain 128-R.

If the programmed CAS latency time is four, the read decoder connects the multiplexer-R 131-R to the multiplexer input 130-2 if no correction is required. If the read decoder 55 receives the correction control signal SUBCLAT-R=1 via the control line 105, indicating that a correction is required, the multiplexer is switched to the multiplexer input 130-1.

Figure 3A:
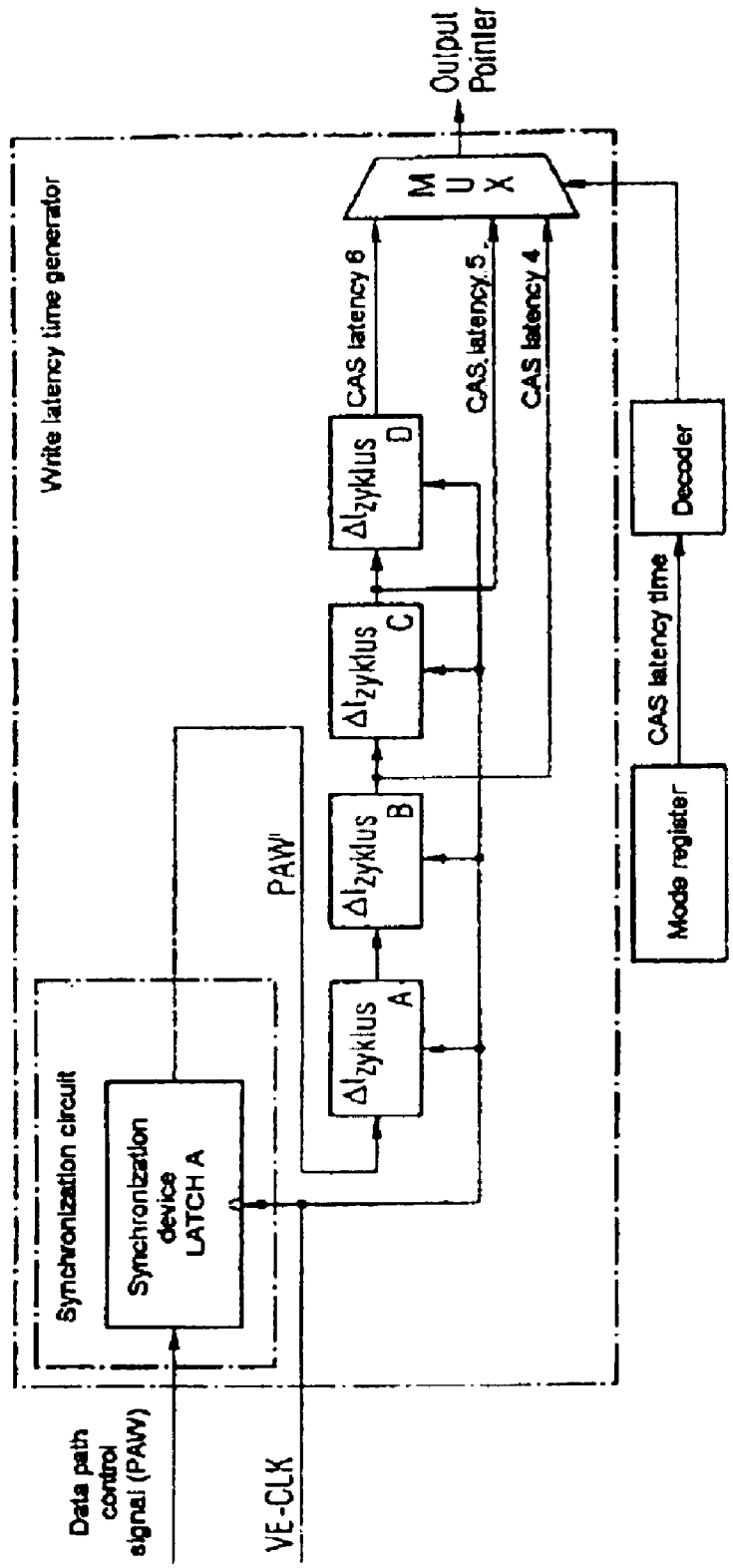
FIG. 3a shows a write latency time generator according to the prior art.

FIG. 8*a* shows a write latency time generator 47 which is contained in the latency time circuit according to the invention. The write latency time generator 47 essentially has the same circuitry design as the write latency time generator according to the prior art as illustrated in FIG. 3*a*. However, the multiplexer 131-W contains an additional multiplexer input, which is connected via a line 129-1 to a tap downstream from the first delay element 128-1. In comparison to the read latency time generator illustrated in Figure the synchronization circuit 127-W has only one synchronization latch, which is clocked by the clock signal VE-CLK.

The write latency time generator 47 contains a multiplexer 108-W with two signal inputs 109-W, 110-W, which can be switched as a function of a control signal (add delay-W) which is applied to a control line 106. The second signal input 110-W is preceded by a delay element 111-W. The internal control signal PAW which is emitted from the sequence controller 13 is emitted to the synchronization circuit 127-W, delayed by the delay element 111-W that is connected, when a corresponding correction control signal (add delay-W=1) is applied.

FIG. 8*b* describes the method of operation of the write latency time generator 47 illustrated in FIG. 8*a*. When a correction control signal SUBCLAT-W=1 is applied, the write decoder 51 drives the multiplexer 131-W such that it is switched to a previous tap in the signal delay chain 128-W. The multiplexer 131-W emits the delayed control signal via the line 133-W to the WR driver 42 in order to transfer the data that is to be read to the internal data bus 37.

FIG. 9 shows timing diagrams to explain the method of operation of the latency time circuit according to the invention.

The timing diagrams in FIGS. 9*a*, 9*b*, and 9*c* show the timings of the three different time regions, as are indicated in FIG. 6*b*.

If the cycle time of the applied clock signal $t_{cycle}$ is in the limit region II, the applied data path control signal PAW/PAR in the latency generators 47/57 is delayed by connecting a delay element 111-R/111-W, which delays the control signal. As a result of the connection or intermediate connection of the delay element 111, as is illustrated in FIGS. 7*a*/8*a*, the data path control signal PAW/PAR will undoubtedly be located after the signal flank of the external clock signal $CLK_{ext}$, and a further correction within the latency time generator 47 or 57 (SUBCLAT=1) will result in the correct latency time.

FIG. 9*b* shows the situation where the cycle time is in the non-critical time region I, as is illustrated in FIG. 6*b*. In this situation, neither a first correction control signal add delay nor a second correction control signal SUBCLAT is produced. The internal data path control signal PAW/PAR is in this situation not additionally delayed in the latency time generators 47/57.

FIG. 9*c* shows the situation where the cycle time of the applied clock signal is in the critical time region III. In this situation, the comparison and delay circuit 100 generates a logic-low first correction control signal (add delay=0) and a logic-high second correction control signal (SUBCLATT=1). This results in the delay element III not being connected in between, and thus in the data path control signal being passed through the respective latency time generator 47, 57 without any delay. The comparison and delay circuit 100, however, generates the logic high second control signal (SUBCLAT=1), so that the multiplexers 131 within the write latency time generator and within the read latency time generator are switched, as is indicated in the tables shown in FIG. 7*b* and FIG. 8*b*.

What is claimed is:

1. A latency time circuit for producing a delayed data enable control signal for synchronous data transfer through a data path of an S-DRAM which is clocked by a clock signal, the latency time circuit comprising:

(a) at least one controllable latency time generator for delaying a decoded data enable control signal with an adjustable latency time;

(b) at least one comparison circuit, which compares the cycle time of the clock signal with a predetermined decoding time; and (c) a signal delay circuit which is connected to and can be switched in by the comparison circuit in order to delay the decoded data enable control signal with a predetermined delay time when the cycle time of the clock signal is in a limit time region which is located about the predetermined decoding time.

2. The latency time circuit according to claim 1 wherein that the comparison circuit reduces the latency time, which is generated by the latency time generator, by one cycle time when the cycle time of the clock signal is in the limit time region.

3. The latency time circuit according to claim 1 wherein the comparison circuit reduces the latency time which is generated by the latency time generator by one cycle time when the cycle time of the clock signal is in a critical time region below the limit time region.

4. The latency time circuit according to claim 1 further comprising:

a MODE register for storing a programmable latency time.

5. The latency time circuit according to claim 4 further comprising:
a decoder, which decodes a programmed latency time in order to produce an internal control signal for the latency time generator.

6. The latency time circuit according to claim 5 wherein the comparison circuit emits a first correction control signal to the decoder when the cycle time of the clock signal is in at least one of the limit time region and the critical time region.

7. The latency time circuit according to claim 6 wherein the controllable latency time generator further comprises a number of series-connected time switching elements, which each pass on a signal which is applied to a signal input to their signal output, delayed by the cycle time.

8. The latency time circuit of claim 7 further comprising a controllable multiplexer connected to each of at least some of the time switching elements.

9. The latency time circuit according to claim 4 wherein the controllable multiplexer has a control input for the internal control signal which is emitted by the decoder.

10. The latency time circuit according to claim 9 wherein the signal delay of all the series-connected time switching elements is equal to a maximum programmable latency time minus two.

11. The latency time circuit according to claim 10 further comprising a test signal generator, which produces a test signal after receiving an enable signal.

12. The latency time circuit according to claim 9
wherein, in the absence of a correction indication, the decoder drives the controllable multiplexer such that the signal delay which is produced by the time switching elements is equal to the programmable latency time reduced by two cycle times, and
wherein, on receiving the correction indication, the decoder drives the controllable multiplexer such that the signal delay produced by the time switching elements is reduced by one cycle time.

13. The latency time circuit of claim 12 wherein the latency time generator further comprises a synchronization circuit for synchronization of the decoded data enable control signal to an internal clock signal.

14. The latency time circuit of claim 9 wherein the latency time generator further comprises a synchronization circuit for synchronization of the decoded data enable control signal to an internal clock signal.

15. The latency time circuit according to claim 1 further comprising:
a decoder, which decodes a programmed latency time in order to produce an internal control signal for the latency time generator.

16. The latency time circuit according to claim 15 wherein the comparison circuit emits a first correction control signal to the decoder when the cycle time of the clock signal is in at least one of the limit time region and the critical time region.

17. The latency time circuit according to claim 15 wherein the at least one comparison circuit further comprises a logic circuit, which logically links temporarily stored correction indication bits to the first correction control signal in order to drive a multiplexer, and to a second correction control signal in order to drive the decoder.

18. The latency time circuit according to claim 1 wherein the controllable latency time generator further comprises a number of series-connected time switching elements, which each pass on a signal which is applied to a signal input to their signal output, delayed by the cycle time.

19. The latency time circuit of claim 18 further comprising a controllable multiplexer connected to each of at least some of the time switching elements.

20. The latency time circuit according to claim 19 wherein the controllable multiplexer has a control input for the internal control signal which is emitted by the decoder.

21. The latency time circuit according to claim 19
wherein, in the absence of a correction indication, the decoder drives the controllable multiplexer such that the signal delay which is produced by the time switching elements is equal to the programmable latency time reduced by two cycle times, and
wherein, on receiving the correction indication, the decoder drives the controllable multiplexer such that the signal delay produced by the time switching elements is reduced by one cycle time.

22. The latency time circuit according to claim 18 wherein the signal delay of all the series-connected time switching elements is equal to a maximum programmable latency time minus two.

23. The latency time circuit of claim 1 wherein the latency time generator further comprises a synchronization circuit for synchronization of the decoded data enable control signal to an internal clock signal.

24. The latency time circuit of claim 1 wherein the comparison circuit further comprises:
a test signal generator for producing a test signal;
a delay circuit, which comprises at least one series-connected delay element, for delaying the test signal,
a clocked clock pulse generator for producing a clock pulse whose pulse duration is equal to the cycle time of the clock signal;
at least one associated transfer gate circuit with an input for application of the delayed test signal,
a clock input for application of the clock signal and having an output to which the delayed test signal which is produced is passed on when the delay time of the delay circuit is shorter than the pulse duration of the clock pulse which is produced by the clock pulse generator; and
a latch circuit for temporary storage of the passed-on test signal,
wherein one signal output of a delay element is in each case connected through an associated transfer gate circuit to the latch circuit.

25. The latency time circuit according to claim 24 wherein the test signal is a logic-high signal pulse with a long pulse duration.

26. The latency time circuit according to claim 25 wherein the test signal which is passed on is temporarily stored as a correction indication bit in the latch circuit.

27. The latency time circuit according to claim 24 wherein the test signal which is passed on is temporarily stored as a correction indication bit in the latch circuit.

28. The latency time circuit according to claim 24 wherein the delay circuit further comprises a first delay element having a first signal delay time, and a series-connected second delay element having a second signal delay time, with the sum of the two signal delay times being substantially equal to a predetermined decoding time.

29. The latency time circuit according to claim 28 wherein the delay circuit further comprises a third delay element with a third signal delay time, with the third signal delay time being substantially equal to the difference between the predetermined decoding time and the first signal delay time.

30. The latency time circuit according to claim 1 further comprising a test signal generator, which produces a test signal after receiving an enable signal from an internal sequence controller. from an internal sequence controller.

31. A method for operating a latency time circuit in an S-DRAM in order to produce a delayed data enable signal, the S-DRAM being clocked by a clock signal, the method comprising:

storing a predetermined decoding time;

determining a cycle time for the clock signal;

comparing the cycle time for the clock signal to the predetermined decoding time by means of a comparison circuit; and controlling at least one latency time generator in accordance with the comparing of the cycle time and the predetermined decoding time to switch in a delay when the cycle time of the clock signal is in a limit time region which is located about the predetermined decoding time.

32. The method of claim 31 wherein the delay reduces a latency time by one cycle time when the cycle time of the clock signal is in the limit time region.

33. The method of claim 32 further comprising producing a test signal from a test signal generator after receiving an enable signal from an internal sequence controller.

34. The method of claim 31 wherein the delay reduces a latency time by one cycle time when the cycle time of the clock signal is in a critical time region which is below the limit time region.

35. The method of claim 34 wherein the controlling of the at least one latency time generator further comprises applying a correction control signal to a decoder for the predetermined decoding time when the cycle time of the clock signal is in at least one of the limit time region and the critical time region.

36. The method of claim 35 further comprising producing a test signal from a test signal generator after receiving an enable signal from an internal sequence controller.

37. The method of claim 31 further comprising producing a test signal from a test signal generator after receiving an enable signal from an internal sequence controller.

* * * * *